(12) United States Patent
Arai (10) Patent No.: US 7,864,291 B2
(45) Date of Patent: Jan. 4, 2011

(54) EXPOSURE APPARATUS AND DEVICE MANUFACTURING METHOD

(75) Inventor: Tsuyoshi Arai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1065 days.

(21) Appl. No.: 11/376,241

(22) Filed: Mar. 16, 2006

(65) Prior Publication Data

US 2006/0209282 A1 Sep. 21, 2006

(30) Foreign Application Priority Data

Mar. 18, 2005 (JP) .............................. 2005-080585

(51) Int. Cl.
*G03B 27/52* (2006.01)
(52) U.S. Cl. .......................................... 355/30; 355/53
(58) Field of Classification Search .................. 355/52, 355/30, 53
See application file for complete search history.

(56) References Cited

U.S. PATENT DOCUMENTS

| | | | | |
|---|---|---|---|---|
| 7,113,254 B2 * | 9/2006 | Van Der Net et al. | ......... | 355/30 |
| 7,292,313 B2 * | 11/2007 | Poon et al. | ..................... | 355/53 |
| 7,367,345 B1 * | 5/2008 | Hemker et al. | ............. | 134/95.2 |
| 7,379,155 B2 * | 5/2008 | Mertens et al. | ................ | 355/53 |
| 2004/0263809 A1 * | 12/2004 | Nakano | ........................ | 355/30 |
| 2005/0018156 A1 * | 1/2005 | Mulkens et al. | ............... | 355/30 |
| 2005/0046813 A1 * | 3/2005 | Streefkerk et al. | ............. | 355/30 |
| 2005/0074704 A1 | 4/2005 | Endo et al. | .................. | 430/322 |
| 2005/0078286 A1 * | 4/2005 | Dierichs et al. | ............... | 355/30 |
| 2005/0113023 A1 | 5/2005 | Bassompiere et al. | ......... | 455/20 |
| 2005/0128445 A1 * | 6/2005 | Hoogendam et al. | .......... | 355/30 |
| 2005/0140948 A1 * | 6/2005 | Tokita | ......................... | 355/30 |
| 2005/0146695 A1 * | 7/2005 | Kawakami | .................... | 355/30 |
| 2005/0179877 A1 * | 8/2005 | Mulkens et al. | ............... | 355/30 |
| 2005/0225734 A1 * | 10/2005 | De Smit et al. | ............... | 355/30 |

(Continued)

FOREIGN PATENT DOCUMENTS

JP 6-124873 5/1994

(Continued)

OTHER PUBLICATIONS

Japanese Office Action dated Sep. 18, 2007, issued in corresponding Japanese patent application No. 2005-080585.

*Primary Examiner*—Edward J Glick
*Assistant Examiner*—Mesfin T Asfaw
(74) *Attorney, Agent, or Firm*—Fitzpatrick, Cella, Harper & Scinto (57) ABSTRACT

An exposure apparatus, which has a projection optical system configured to project a pattern of a reticle onto a substrate, and exposes the substrate to light via the reticle and the projection optical system, with a space between the projection optical system and the substrate filled with liquid. A supply nozzle supplies liquid to the space, a supply path supplies the liquid to the supply nozzle, a bypass branches from the supply path, and a supply control valve changes a flow rate of the liquid supplied from the supply path to the supply nozzle to control the supply of the liquid to the space, and a liquid quality sensor arranged in the bypass measures a purity of the liquid. The supply of the liquid to the space is controlled based on a measurement performed by the liquid quality sensor, so that liquid having a purity satisfying a standard is supplied to the space.

14 Claims, 9 Drawing Sheets

U.S. PATENT DOCUMENTS

| | | |
|---|---|---|
| 2005/0259236 A1* | 11/2005 | Straaijer .................. 355/72 |
| 2005/0263068 A1* | 12/2005 | Hoogendam et al. ........ 118/668 |
| 2006/0082746 A1* | 4/2006 | Mertens et al. ............. 355/53 |
| 2006/0187433 A1 | 8/2006 | Nagahashi .................. 355/53 |
| 2007/0009841 A1 | 1/2007 | Endo et al. ................. 430/331 |
| 2007/0242241 A1* | 10/2007 | Nagasaka et al. ............ 355/30 |
| 2008/0018869 A1* | 1/2008 | Nagahashi .................. 355/30 |

FOREIGN PATENT DOCUMENTS

| | | |
|---|---|---|
| JP | 2002-23860 | 1/2002 |
| JP | 2005-136374 | 5/2005 |
| JP | 2005-514865 | 5/2005 |
| WO | WO 99/49504 | 9/1999 |
| WO | WO 2004/093130 A2 | 10/2004 |
| WO | WO 2005/038888 A1 | 4/2005 |

* cited by examiner

EXPOSURE APPARATUS AND DEVICE MANUFACTURING METHOD

This application claims the benefit of Japanese Patent Application No. 2005-080585, filed on Mar. 18, 2005, which is hereby incorporated by reference herein in its entirety.

FIELD OF THE INVENTION

The present invention relates to an exposure apparatus and, more particularly, to an exposure apparatus for exposing a substrate to light through a reticle and a projection optical system, with a space between the projection optical system and the substrate filled with liquid.

BACKGROUND OF THE INVENTION

In the semiconductor device manufacturing process, a reduction projection exposure apparatus, which reduces the pattern formed on a mask and transfers the reduced pattern onto a substrate, is adopted. In order to achieve further micronization of the pattern to be transferred, techniques for increasing the resolving power of the exposure apparatus are proposed. In such techniques, a method of shortening the wavelength of exposure light and a method of increasing the numerical aperture (NA) of a projection optical system are generally used. As the numerical aperture of the projection optical system increases, its depth of focus decreases. The relationship between these factors can be generally expressed by:

(resolving power)=$k_1 \lambda / NA$ (depth of focus)=$\pm k_2 \lambda / NA^2$ where $\lambda$ is the wavelength of exposure light, NA is the numerical aperture of the projection optical system, and $k_1$ and $k_2$ are process coefficients.

As for the wavelength of exposure light, an ArF excimer laser, which emits light having an oscillation wavelength of around 193 nm, and even a fluorine ($F_2$) excimer laser, which emits light having an oscillation wavelength of around 157 nm, have been developed. Independently of these lasers, a liquid immersion method has received a great deal of attention as a technique for increasing the resolving power. Conventionally, the space between the substrate and the lowermost surface of the projection optical system is filled with gas. However, the immersion method executes exposure while the space is filled with liquid.

Letting $\lambda$ be the wavelength of exposure light in the air, and n be the refractive index of liquid used for liquid immersion, the above-described resolving power and the depth of focus are expressed by:

(resolving power)=$k_1 (\lambda/n)/NA$ (depth of focus)=$\pm k_2 (\lambda/n)/NA^2$.

That is, the effect of liquid immersion amounts to using exposure light having a wavelength of 1/n. In other words, when a projection optical system uses the immersion method, its depth of focus increases to n times if its NA remains the same. This applies to any pattern shape. Moreover, this method can be combined with a currently proposed phase shift method or a modification illumination method.

In recent years, the immersion method has been attempted to be applied to exposure apparatuses. Japanese Patent Laid-Open No. 6-124873 discloses an example of a conventional exposure apparatus to which the immersion method is applied. This exposure apparatus fills a liquid tank with liquid, thereby filling the space between the wafer and the lowermost surface of the projection optical system. PCT International Publication No. WO 99/049504 discloses another example of the conventional exposure apparatus. This exposure apparatus uses a method of filling, with liquid, only the space between the projection optical system and the wafer surface.

An exposure apparatus unloads one wafer from the wafer stage after the wafer is exposed with a predetermined shot layout, and loads a new wafer to repeat the exposure operation. In a liquid supply method of a liquid immersion exposure apparatus, which executes exposure while the space between the projection optical system and the substrate is filled with liquid, liquid supply is stopped in wafer exchange. A new wafer is then loaded under the projection optical system. When the apparatus is ready for exposure, it restarts the liquid supply. In the scan type exposure apparatus, a direction in which liquid is supplied may be changed in accordance with the scanning direction. When such a scan type exposure apparatus switches nozzles for liquid supply in accordance with the scanning direction, the individual nozzles intermittently supply the liquid. Moreover, liquid supply must be stopped for every step of driving of the wafer, whether the apparatus is the scan type or not. In any other operation mode, such as a measurement mode for alignment or focusing, liquid supply must be temporarily stopped.

Assume that a pump for liquid supply is controlled to control the start/stop of the liquid supply. In this case, during intermittent stop of the liquid supply, gas or dust may mix in the liquid through a portion in a liquid supply nozzle, where the liquid surface is exposed to the air. Exposure using the liquid with gas or dust worsens the liquid quality uniformity, generates air bubbles, varies the photosensitive characteristic of the resist, or shields the optical path. These factors degrade the imaging performance and contaminate the optical components, such as the lens surface, which come into contact with the liquid, resulting in a decrease in light amount. That is, in the semiconductor device manufacturing process using the immersion exposure apparatus, it is necessary to prevent gas, such as air, from dissolving in, or dust from mixing in, liquid to be supplied between the projection optical system and the substrate.

Moreover, repetition of the start/stop of the liquid supply largely varies the flow rate of the liquid which flows in the liquid supply device, and flows through the path from the liquid supply device to the supply nozzle. This largely varies the flow rate of the liquid, which passes through temperature control mechanisms, such as a heater and a temperature sensor, for liquid temperature control. This makes it difficult to control the temperature of the liquid supplied between the projection optical system and the substrate. Unsatisfactory temperature control adversely affects the imaging performance due to a variation in refractive index of the liquid supplied.

Assume that a pump of the liquid supply device controls the start/stop of the liquid supply. This structure inhibits the productivity from increasing, because a response delay is large, and flow rate stabilization takes a long time.

SUMMARY OF THE INVENTION

The present invention has been made in consideration of the above background, and has as its exemplary object to suppress a decease in productivity associated with supplying liquid.

According to one aspect of the present invention, there is provided an exposure apparatus, which has a projection optical system configured to project a pattern of a reticle onto a substrate, and exposes the substrate to light via the reticle and the projection optical system, with a space between the projection optical system and the substrate filled with liquid. The apparatus comprises a supply nozzle configured to supply liquid to the space, a supply path configured to supply the liquid to the supply nozzle, a bypass, which branches from the supply path, and a supply control valve configured to change a flow rate of the liquid supplied from the supply path to the supply nozzle and a flow rate of the liquid supplied from the supply path to the bypass.

According to a preferred embodiment of the present invention, the supply control valve can be configured to selectively supply the liquid from the supply path to one of the supply nozzle and the bypass.

According to a preferred embodiment of the present invention, the apparatus can further comprise a flow rate regulator configured to keep the flow rate of the liquid, which flows through the supply path, substantially constant.

According to a preferred embodiment of the present invention, the apparatus can further comprise a recovery nozzle configured to recover liquid from the space.

According to a preferred embodiment of the present invention, the apparatus can further comprise a recovery path configured to transfer the liquid recovered by the recovery nozzle, wherein the bypass can be configured to merge into the recovery path.

According to a preferred embodiment of the present invention, the apparatus can further comprise a recovery control valve configured to change a flow rate of the liquid recovered from the recovery nozzle to the recovery path and a flow rate of the liquid recovered from the bypass to the recovery path.

According to a preferred embodiment of the present invention, the apparatus can further comprise a temperature sensor configured to measure temperature of the liquid, and a temperature regulator configured to regulate the temperature of the liquid based on a measurement performed by the temperature sensor.

According to a preferred embodiment of the present invention, the temperature sensor can be arranged in the bypass.

According to a preferred embodiment of the present invention, the apparatus can further comprise temperature sensor arranged in the bypass and configured to measure temperature of the liquid, and a temperature regulator configured to regulate the temperature of the liquid based on measurement performed by the temperature sensor, wherein the supply control valve can be configured to supply the liquid from the supply path to at least the bypass.

According to a preferred embodiment of the present invention, the apparatus can further comprise a liquid quality sensor configured to measure a property of the liquid, wherein the supply control valve can be controlled based on a measurement performed by the liquid quality sensor.

According to a preferred embodiment of the present invention, the bypass can be arranged along a portion of the projection optical system.

According to a preferred embodiment of the present invention, the bypass can be arranged along at least a portion of the supply nozzle.

According to a preferred embodiment of the present invention, the supply control valve can be arranged near the supply nozzle.

According to another aspect of the present invention, there is provided a method of manufacturing a device, the method comprising steps of exposing a substrate to light via a reticle using the exposure apparatus discussed above, developing the exposed substrate, and processing the developed substrate to manufacture the device.

Other features and advantages of the present invention will be apparent from the following description, taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below.

First Embodiment

Figure 1:
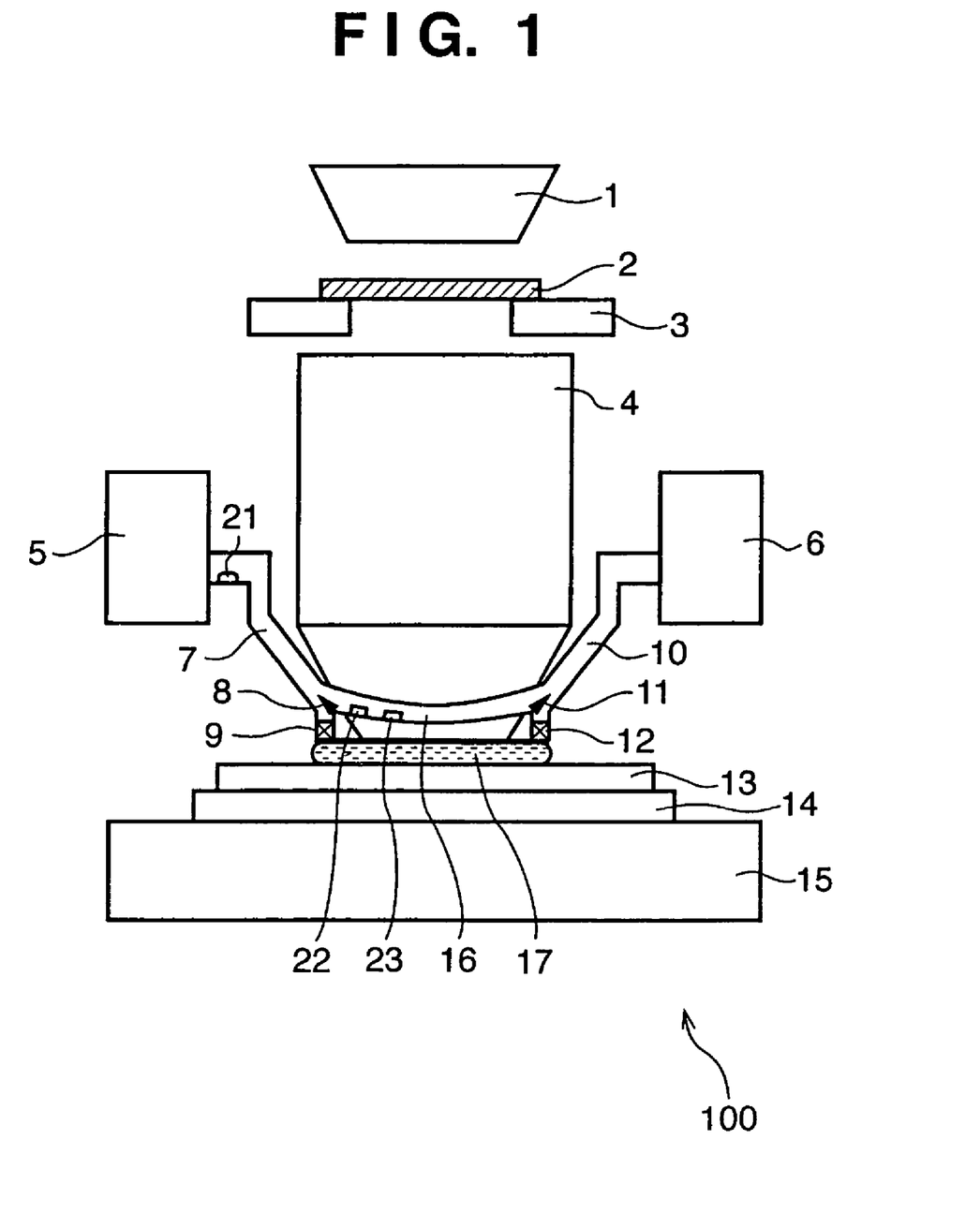
FIG. 1 is a view schematically showing the structure of a liquid immersion exposure apparatus according to the first embodiment of the present invention.
Figure 2:
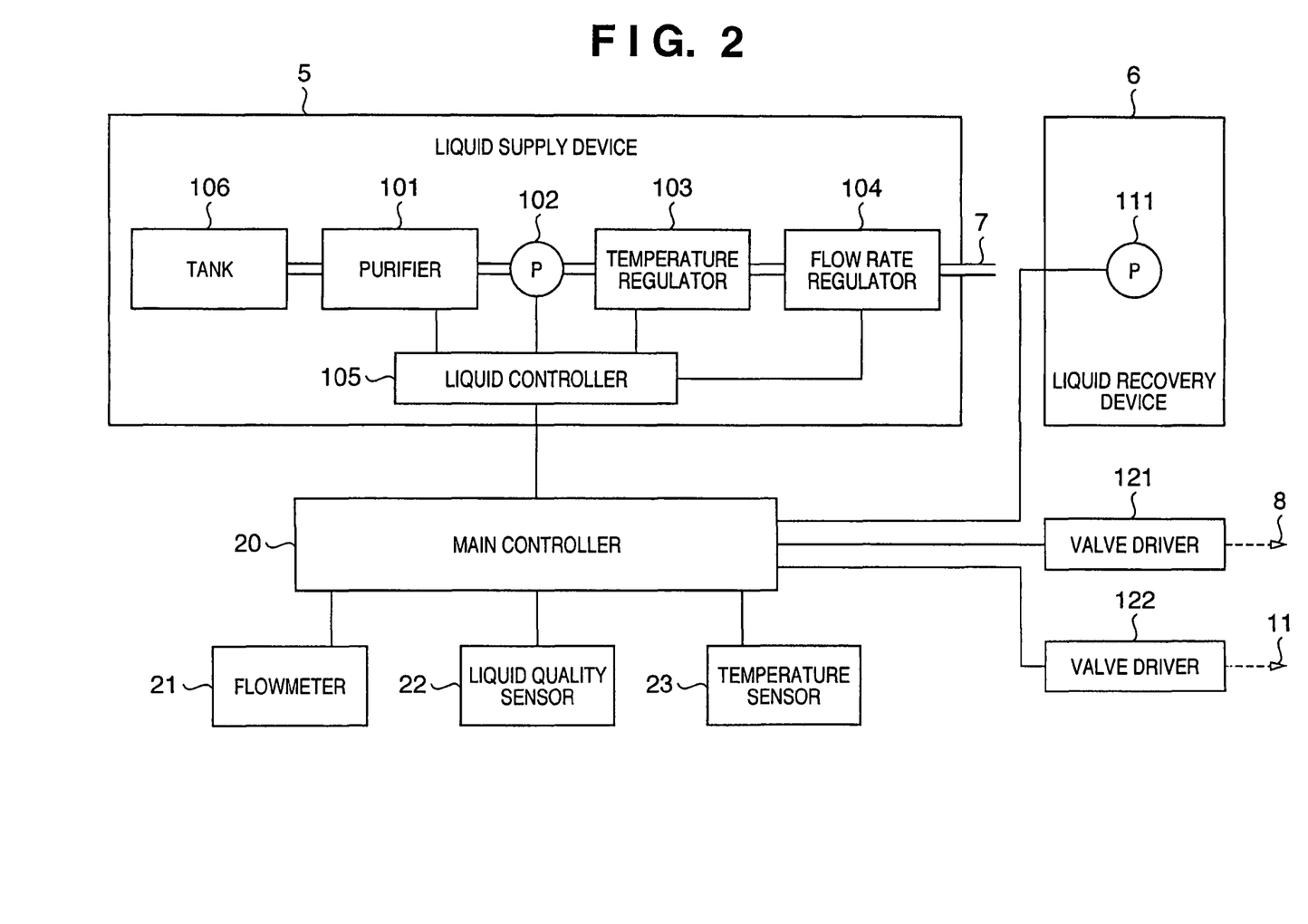
FIG. 2 is a block diagram showing the arrangement of a control system of the immersion exposure apparatus shown in FIG. 1.

FIG. 1 is a view schematically showing the structure of a liquid immersion exposure apparatus according to a preferred embodiment of the present invention. FIG. 2 is a block diagram showing the arrangement of a control system of a liquid immersion exposure apparatus 100 shown in FIG. 1. An illumination optical system 1 illuminates a reticle, an original plate, or a mask 2 with light emitted from an exposure light source (not shown). If the exposure apparatus 100 is of the scan type, the illumination optical system 1 typically illuminates the reticle 2 with light having a slit like or an arcuate sectional shape. The exposure apparatus 100, which exemplifies the scan type exposure apparatus (scanner), will be described below. However, the present invention can also be applied to the non-scan type exposure apparatus (stepper).

While the illumination optical system 1 illuminates the reticle 2, a reticle stage 3, which holds the reticle 2 and a wafer stage 15, which holds a wafer (substrate) 13 by inserting a wafer chuck 14, move by scanning in synchronism with each other. By synchronous scanning, an image of the entire pattern on the reticle 2 is continuously formed on the wafer 13 through a projection optical system 4. A photoresist (photosensitive agent) applied to the surface of the wafer 13 is exposed to light to form a latent image pattern.

A supply nozzle 9 to supply liquid to the space (also to be referred to as the liquid immersion space hereinafter) between the wafer 13 and the lowermost surface of the projection optical system 4 is connected to a liquid supply device 5 through a supply path 7. A recovery nozzle 12 to recover liquid is connected to a liquid recovery device 6 through a recovery path 10.

The liquid supply device 5 can, for example, include a tank 106 to store liquid, a purifier 101 to purify liquid, a pump 102 to supply liquid, a temperature regulator 103 to regulate the temperature of the liquid, a flow rate regulator 104 to regulate the flow rate of the liquid to be supplied, and a liquid controller 105 to control the above components in accordance with an instruction or data sent from a main controller 20. The liquid recovery device 6 may include a pump 111 to be driven in accordance with an instruction sent from the main controller 20 to withdraw the liquid.

As the immersion liquid, pure water (preferably, ultra pure water), functional water, or a fluorinated liquid is preferable. Preferably, dissolved gases are sufficiently removed from the immersion liquid in advance by using a degassing device. This is to suppress generation of air bubbles, and additionally, to immediately absorb air bubbles if they are, in fact, generated. For example, assume that the gases used are nitrogen and oxygen contained in the ambient air in large quantities. When each gas is removed from the liquid by 80% or more of its dissolution limit, it is possible to sufficiently suppress generation of air bubbles. The degassing device can be arranged as, for example, part of the purifier or another constituent component.

The supply path 7 branches into the path toward the supply nozzle 9 and a bypass (branch path) 16. The branch portion of the supply path 7 has a supply control valve 8. Liquid, which flows into the supply nozzle 9, is supplied to the immersion space between the wafer 13 and the lowermost surface of the projection optical system 4. The liquid is then recovered by the liquid recovery device 6 through the recovery nozzle 12 and recovery path 10. On the other hand, the liquid, which flows into the bypass 16, is recovered by the liquid recovery device 6 through the bypass 16 and recovery path 10.

As shown in FIG. 1, if both the liquid recovered by the recovery nozzle 12 and the liquid which passes through the bypass 16 are recovered through the recovery path 10, a recovery control valve 11 is preferably arranged at the portion where the bypass 16 and the path connected to the recovery nozzle 12 merge. Alternatively, a device to recover the liquid recovered by the recovery nozzle 12 may be provided separately from a device to recover the liquid which passes through the bypass 16.

Figure 3:
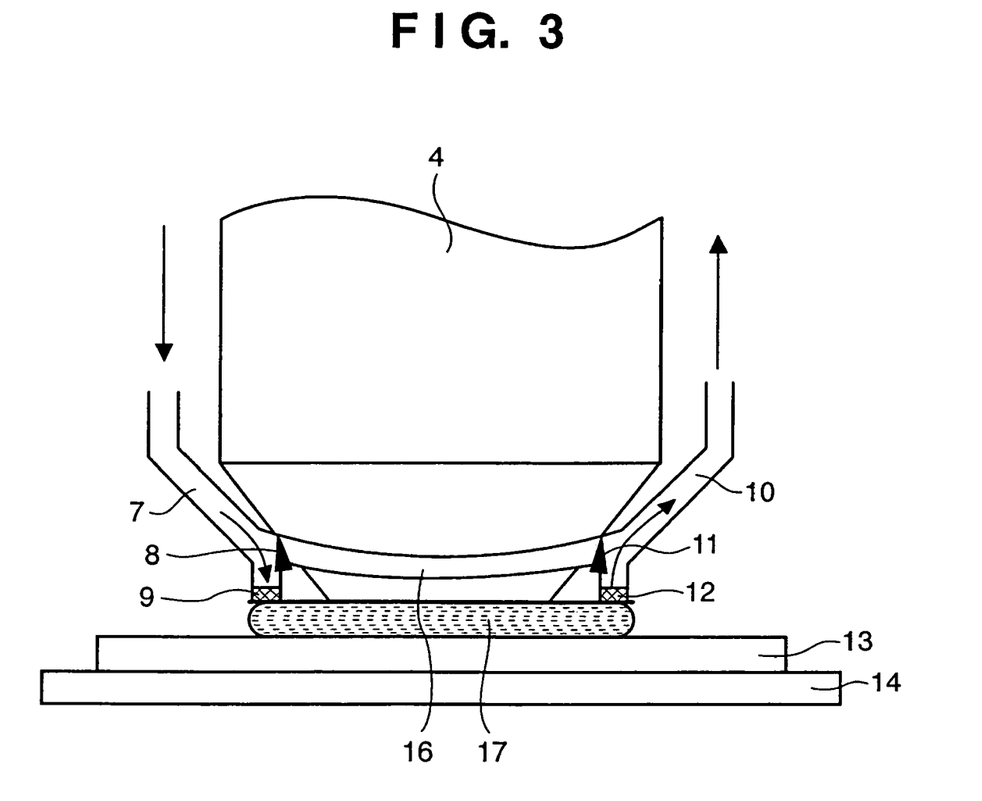
FIG. 3 is a view schematically showing the liquid flow in the first embodiment of the present invention.
Figure 4:
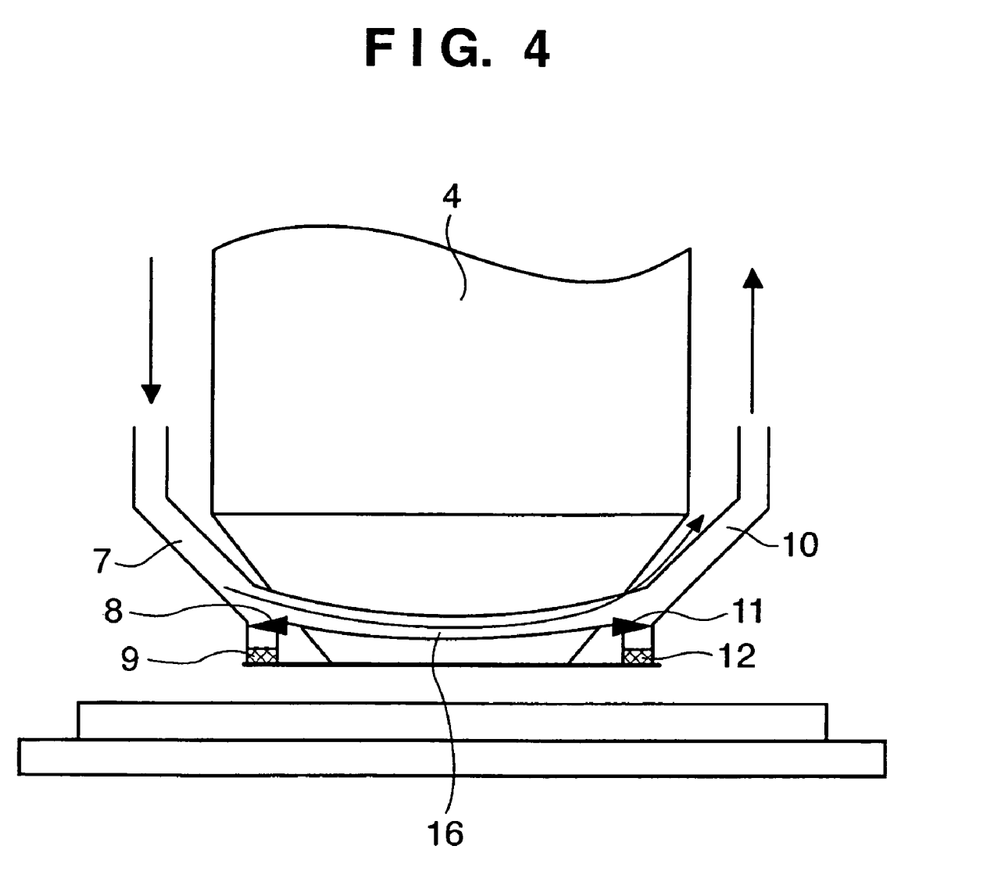
FIG. 4 is a view schematically showing the liquid flow in the first embodiment of the present invention.

Even if the recovery control valve 11 is omitted, the liquid recovery device 6 can recover the liquid in the bypass 16 by suction. However, the recovery control valve 11 may be arranged in a recovery route. In this case, the bypass 16 is closed while liquid is supplied to the immersion space, as shown in FIG. 3, and the recovery nozzle 12 is closed while the liquid is not supplied to the immersion space, to prevent backflow, as shown in FIG. 4.

If liquid should be supplied to the immersion space (typically, in exposure, i.e., in pattern transfer), the main controller 20 controls the supply control valve 8, such that the liquid supplied through the supply path 7 flows into the supply nozzle 9. The main controller 20 also controls the recovery control valve 11, such that the liquid supplied to the immersion space is recovered through the recovery nozzle 12. On the other hand, if liquid should not be supplied (typically, in non exposure, for example, in measurement for alignment or focusing), the main controller 20 controls the supply control valve 8, such that the liquid supplied through the supply path 7 flows into the bypass 16. The main controller 20 also controls the recovery control valve 11, such that the liquid, which passes through the bypass 16, flows into the recovery path 10. The main controller 20 controls valve drivers (actuators to drive the control valves) 121 and 122 to control the control valves 8 and 11.

To temporarily stop liquid supply to the immersion space, the pump 102 of the liquid supply device 5 need not be stopped. The supply control valve 8 need only be switched, such that the liquid flows into the bypass 16. At this time, the supply control valve 8 is preferably arranged on the immediately forward side of the supply nozzle 9, so as to decrease the amount of liquid collecting between the supply nozzle 9 and the supply control valve 8.

The bypass 16 has a sectional area large enough to supply the liquid at the same flow rate as that of the liquid which flows through the immersion space and recovery nozzle 12. This makes it possible to supply the liquid through the supply path 7 at a constant flow rate, without considering whether it should be supplied through the immersion space and recovery nozzle 12, or through the bypass 16. In this manner, the flow rate (i.e., the flow rate of the liquid supplied from the liquid supply device 5) of the liquid supplied through the supply path 7 is kept constant. Liquid temperature regulating is thus facilitated, so as to suppress a temperature variation of the liquid.

A temperature sensor 23 can be arranged in a liquid flow route, such as the bypass 16. The temperature sensor 23 forms part of a feedback loop for temperature regulating. In an example of the control system shown in FIG. 2, the measurement result obtained by the temperature sensor 23 is sent to the main controller 20, and further sent to the liquid controller 105. The liquid controller 105 controls the temperature regulator 103 to keep the temperature of the liquid supplied to the supply path 7 to be constant. The measurement result obtained by the temperature sensor 23 may be directly sent to the liquid controller 105. Alternatively, if the temperature regulator 103, itself, has a controller, the measurement result may be directly sent to the temperature regulator 103.

The temperature sensor 23 may be arranged in the supply path 7, in the supply nozzle 9 or its neighborhood, or in the recovery nozzle 12 or its neighborhood. Alternatively, temperature sensors 23 may be arranged in all or some of the above components. When a temperature sensor is arranged in the supply path 7, the temperature of the liquid can always be measured, even if the liquid is supplied exclusively to the immersion space and bypass 16 (i.e., if the liquid is supplied to only one of them). When a temperature sensor is arranged in the recovery nozzle 12 or its neighborhood, a temperature variation of the liquid in the immersion space can be fed back. When temperature sensors are arranged in the supply nozzle 9 or its neighborhood, and in the recovery nozzle 12 or its neighborhood, the temperature of the liquid in the immersion space can be estimated with a higher accuracy on the basis of the measurement result obtained by both the temperature sensors.

The supply control valve 8 need not necessarily supply the liquid exclusively to the immersion space and bypass 16, and may control the ratio of the liquid to be supplied to the immersion space to the liquid to be supplied to the bypass 16. In this case, the liquid can be supplied to the bypass 16 not only in non-exposure, but also, in exposure. Hence, the temperature of the liquid can always be measured, even if the temperature sensor 23 is arranged in the bypass 16, as described above.

If the temperature sensor 23 is arranged in the supply path 7, the liquid to be supplied to the immersion space may be contaminated by the temperature sensor 23. For this reason, the temperature sensor 23 needs to be coated with a material such as Teflon®, which is inactive in the liquid. However, a coating is inconvenient to realize a higher-speed response characteristic to temperature control of the liquid supplied to the immersion space. When the temperature sensor 23 is arranged in the bypass 16, the exposure performance does not suffer, even if the liquid quality deteriorates by the temperature sensor 23. Hence, satisfactory temperature control can be realized without coating the temperature sensor 23.

A liquid quality sensor 22 can be arranged in a liquid flow route, such as the bypass, to monitor the liquid quality. The liquid quality sensor 22 may, for example, include a resistance meter. On the basis of the measurement result obtained by the liquid quality sensor 22, the main controller 20 can control the supply control valve 8, and the like, so as not to supply the liquid to the immersion space until the liquid properties satisfy a standard. This makes it possible to reduce unsatisfactory exposure due to poor liquid properties.

A flowmeter 21 can be arranged in the supply path 7. On the basis of the measurement result obtained by the flowmeter 21, the main controller 20 controls the flow rate regulator 104 through the liquid controller 105 so as to supply the liquid to the supply path 7 at a constant flow rate.

The detailed operation of the immersion exposure apparatus 100, according to a preferred embodiment of the present invention, will be exemplified below. Pure water can be used as the liquid to be supplied to the immersion space. Pure water is supplied to the liquid supply device 5 after being purified by a filter, and then temporarily stored in the tank 106. After that, the pure water can be further purified by the purifier 101. Since pure water is a general material frequently used in semiconductor factories, it is typically provided by factory equipment. The temperature regulator 103 regulates the temperature of pure water to be constant. The pure water can be degassed by a vacuum degassing device.

As the pump 102 is activated, pure water in the tank 106 is supplied to the temperature regulator 103 through the purifier 101. The pure water temperature-regulated by the temperature regulator 103 is supplied to the supply path 7 through the flow rate regulator 104. In this stage, the supply control valve 8 is being set on the bypass 16 side, so the liquid is supplied to the liquid recovery device 6.

In this state, a process waits until a predetermined time elapses, or until the liquid quality stabilizes, by monitoring the liquid quality in accordance with a measured value (for example, a resistance value), obtained by the liquid quality sensor 22. This makes it possible to improve the exposure performance immediately after the start of liquid supply.

The wafer 13 coated with a photosensitive agent is conveyed onto the chuck 14 of the wafer stage 15. Through measurement operations, such as alignment, the wafer stage 15 is moved to a position where its first shot scanning exposure operation starts.

After that, the supply control valve 8 is switched to the supply nozzle 9 side to fill the immersion space between the projection optical system 4 and the wafer 13 with pure water. At this time, the liquid is supplied to the bypass 16 side at a constant flow rate without stopping liquid supply by the liquid supply device 5. For this reason, pure water having a stable purity (liquid quality), and temperature, can be instantaneously supplied to the immersion space only by controlling the supply control valve 8.

As the immersion space is filled with the liquid, scanning exposure of the wafer stage 15 and reticle stage 3 starts. The liquid supplied to the immersion space is recovered through the recovery nozzle 12. After one shot exposure is completed, the scanning operations of the wafer stage 15 and reticle stage 3 are stopped, and the wafer stage 15 moves step by step to a position where its next shot scanning operation starts. During stepping movement of the wafer stage 15, to stop liquid supply from the supply nozzle 9 to the immersion space, the supply control valve 8 is switched from the supply nozzle 9 side to the bypass 16 side.

After the entire surface of the wafer is exposed, the supply control valve 8 is switched to the bypass 16 side. The wafer stage 15 is moved to a wafer exchange position to exchange the exposed wafer for the next wafer.

The bypass 16 is arranged along with, for example, part of the projection optical system 4 and/or at least part of the supply nozzle 9, for example, to surround their periphery. This arrangement contributes to temperature control of the projection optical system 4.

When the supply nozzle 9 and supply control valve 8 are arranged as close as possible, the liquid collecting in the supply nozzle 9 in switching the supply control valve 8 to the bypass 16 side can be small. Even if the liquid is contaminated by a foreign substance, such as air or dust, its influence on the exposure performance is small.

The liquid, which has passed through the bypass 16, may be recovered and reused separately from the liquid which has passed through the immersion space. That is, the liquid which has passed through the bypass 16 may be returned to the tank 106 for reuse, since it is relatively clean, without being contaminated by the photosensitive agent on the wafer.

As described above, according to the preferred embodiment of the present invention, the immersion exposure apparatus can project well a micropattern without deteriorating the properties of liquid supplied to improve the imaging performance, thus increasing the productivity.

Second Embodiment

This embodiment is a modification of the first embodiment. Details, such as an arrangement, principle, and idea, which are not particularly referred to can follow the first embodiment.

Figure 5:
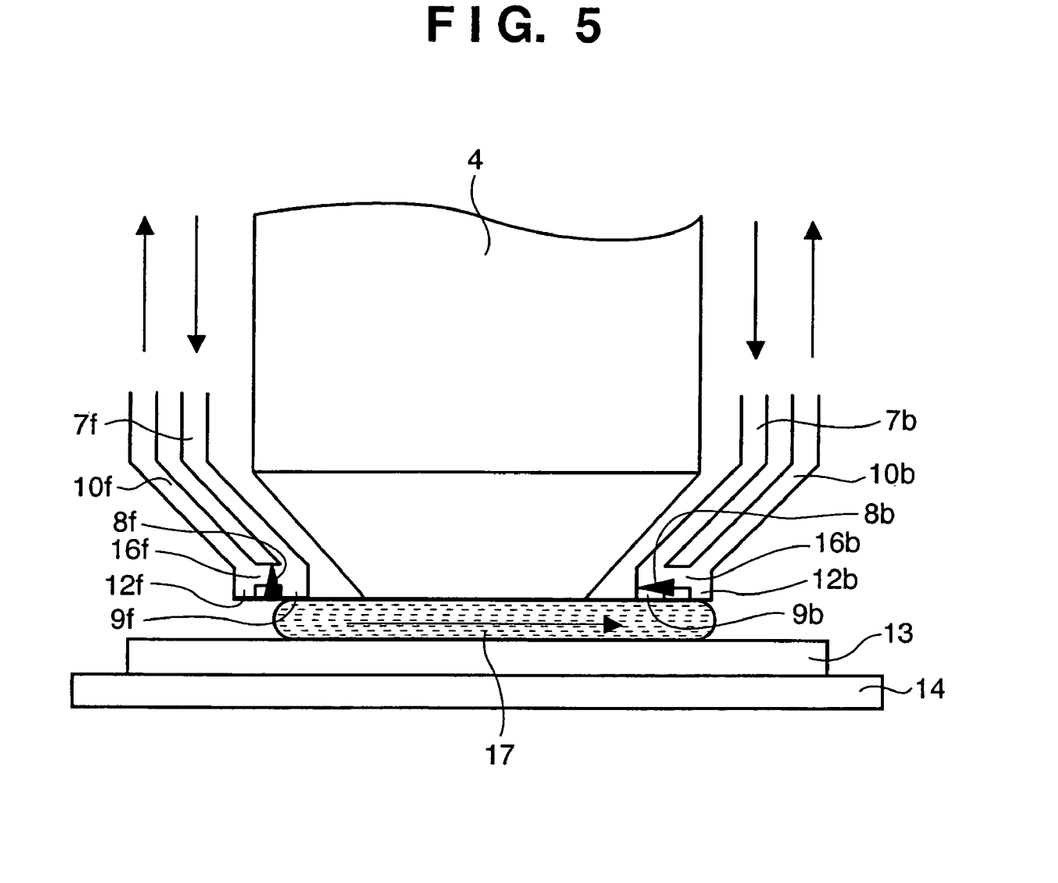
FIG. 5 is a view schematically showing the structure of a liquid immersion exposure apparatus according to the second embodiment of the present invention.
Figure 6:
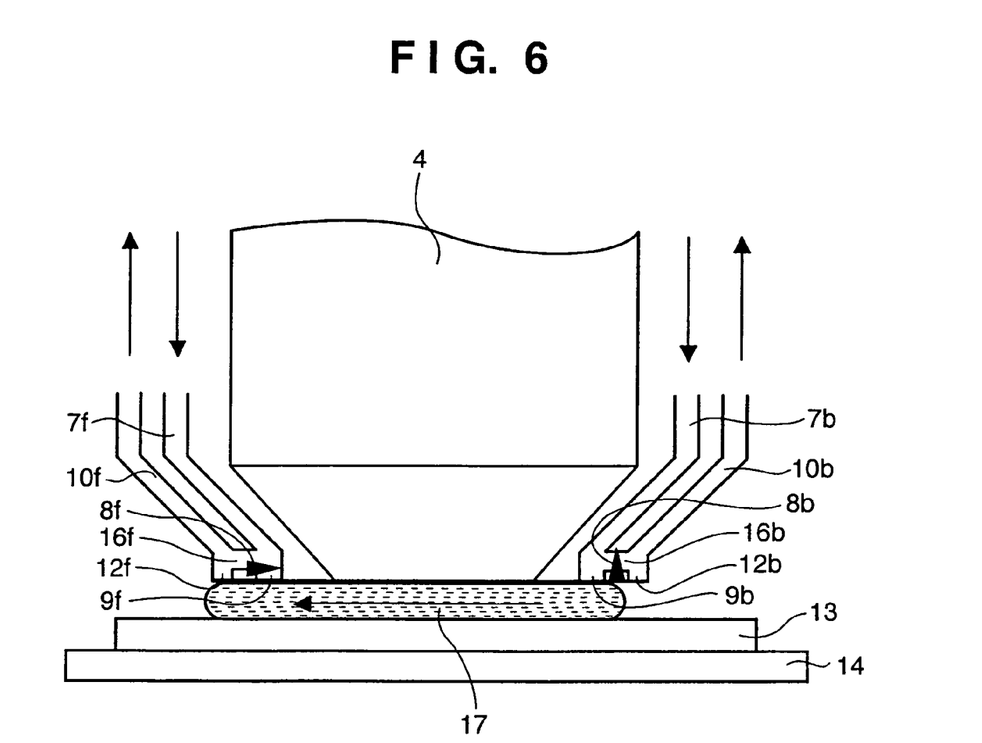
FIG. 6 is a view schematically showing the structure of the immersion exposure apparatus according to the second embodiment of the present invention.
Figure 7:
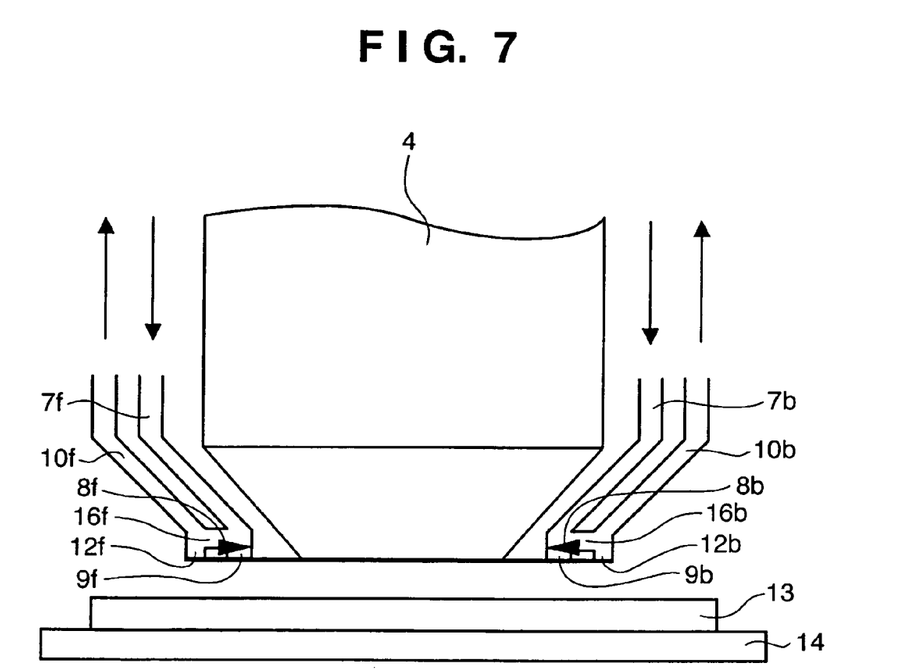
FIG. 7 is a view schematically showing the structure of the immersion exposure apparatus according to the second embodiment of the present invention.

FIGS. 5 to 7 are views schematically showing the structure of the immersion exposure apparatus according to the first embodiment of the present invention. The immersion exposure apparatus according to this embodiment comprises a plurality of liquid routes, each including a supply path, supply nozzle, control valve, recovery nozzle, and recovery path. The first liquid route includes a supply pipe 7f, supply nozzle 9f, control valve 8f, recovery nozzle 12f, and recovery pipe 10f. The second liquid route includes a supply pipe 7b, supply nozzle 9b, control valve 8b, recovery nozzle 12b, and recovery pipe 10b. Liquid supplied from the supply nozzle in the first route to the immersion space can be recovered through the recovery nozzle in the second route. Alternatively, the liquid supplied from the supply nozzle in the second route to the liquid immersion space can be recovered through the recovery nozzle in the first route. When a supply nozzle and recovery nozzle in the same route are arranged adjacent to each other, a bypass can be formed by making the supply nozzle communicate with the recovery nozzle.

For example, as shown in FIG. 5, when the two nozzles 9f and 12f are juxtaposed in the radius direction of a projection optical system 4, the liquid supplied from a liquid supply device 5 flows through the supply path 7f and enters the immersion space from the supply nozzle 9f. At this time, the control valve 8f is controlled to close a bypass 16f and open the supply nozzle 9f side. Liquid 17 supplied to the immersion space is recovered through the recovery nozzle 12b. The liquid 17 flows through the recovery path 10b and is recovered by the liquid recovery device 6. At this time, the control valve 8b is controlled to close the supply nozzle 9b side and open a bypass 16b. Accordingly, not only the liquid, which flows through the supply path 7f and is supplied to the immersion space, but also, the liquid, which passes through the supply path 7b, are recovered by the recovery path 10b.

When a supply nozzle to supply liquid to the immersion space is changed, liquid is supplied to the immersion space through the supply nozzle 9b, as shown in FIG. 6. The liquid supplied to the immersion space is recovered through the recovery nozzle 12f. At this time, the control valve 8f is controlled to close the supply nozzle 9f side and to open the bypass 16f. Accordingly, not only the liquid, which flows through the supply path 7b and is supplied to the immersion space, but also the liquid, which passes through the supply path 7f, are recovered through the recovery path 10f.

As shown in FIG. 7, to stop liquid supply to the immersion space, the control valve 8f closes the supply nozzle 9f to introduce the liquid to the recovery path 10f. The supply control valve 8b closes the supply nozzle 9b to introduce the liquid to the recovery path 10b.

As described above, according to the preferred embodiment of the present invention, the immersion exposure apparatus can project well a micropattern without deteriorating the properties of liquid supplied to improve the imaging performance, thus increasing the productivity.

Third Embodiment

Figure 8:
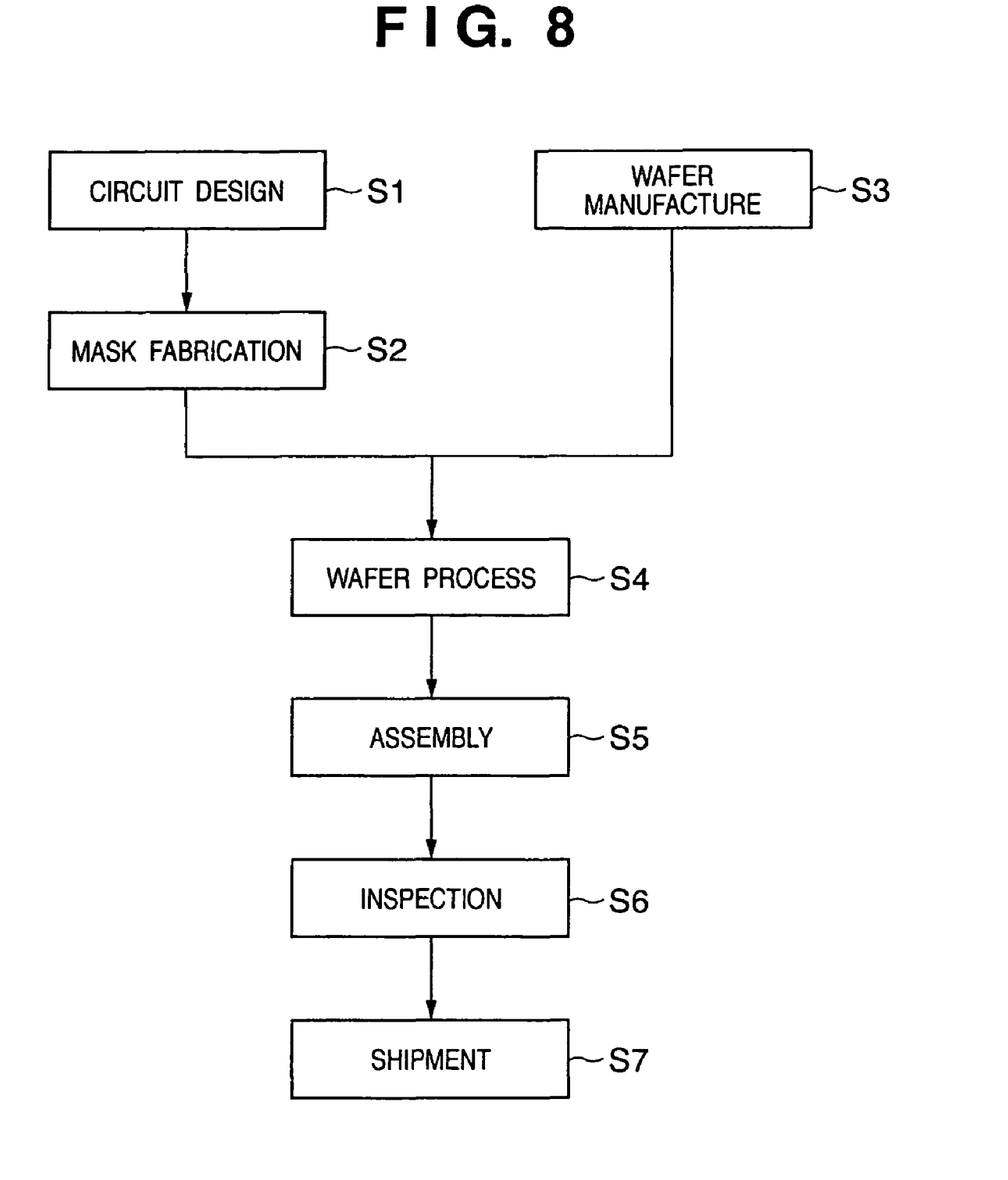
FIG. 8 is a flowchart showing the flow of the overall semiconductor device manufacturing process.

A semiconductor device manufacturing process using the above-described exposure apparatus will be described next. FIG. 8 is a flowchart showing the flow of the overall semiconductor device manufacturing process. In step 1 (circuit design), a semiconductor device circuit is designed. In step 2 (mask fabrication), a mask is fabricated on the basis of the designed circuit pattern. In step 3 (wafer manufacture), a wafer is manufactured using a material such as silicon. In step 4 (wafer process), called a pre-process, an actual circuit is formed on the wafer by lithography, using the mask and wafer. In step 5 (assembly), called a post-process, a semiconductor chip is formed by using the wafer manufactured in step 4. This step includes an assembly step (dicing and bonding) and a packaging step (chip encapsulation). In step 6 (inspection), the semiconductor device manufactured in step 5 undergoes inspections, such as an operation confirmation test and a durability test. After these steps, the semiconductor device is completed and shipped in step 7.

Figure 9:
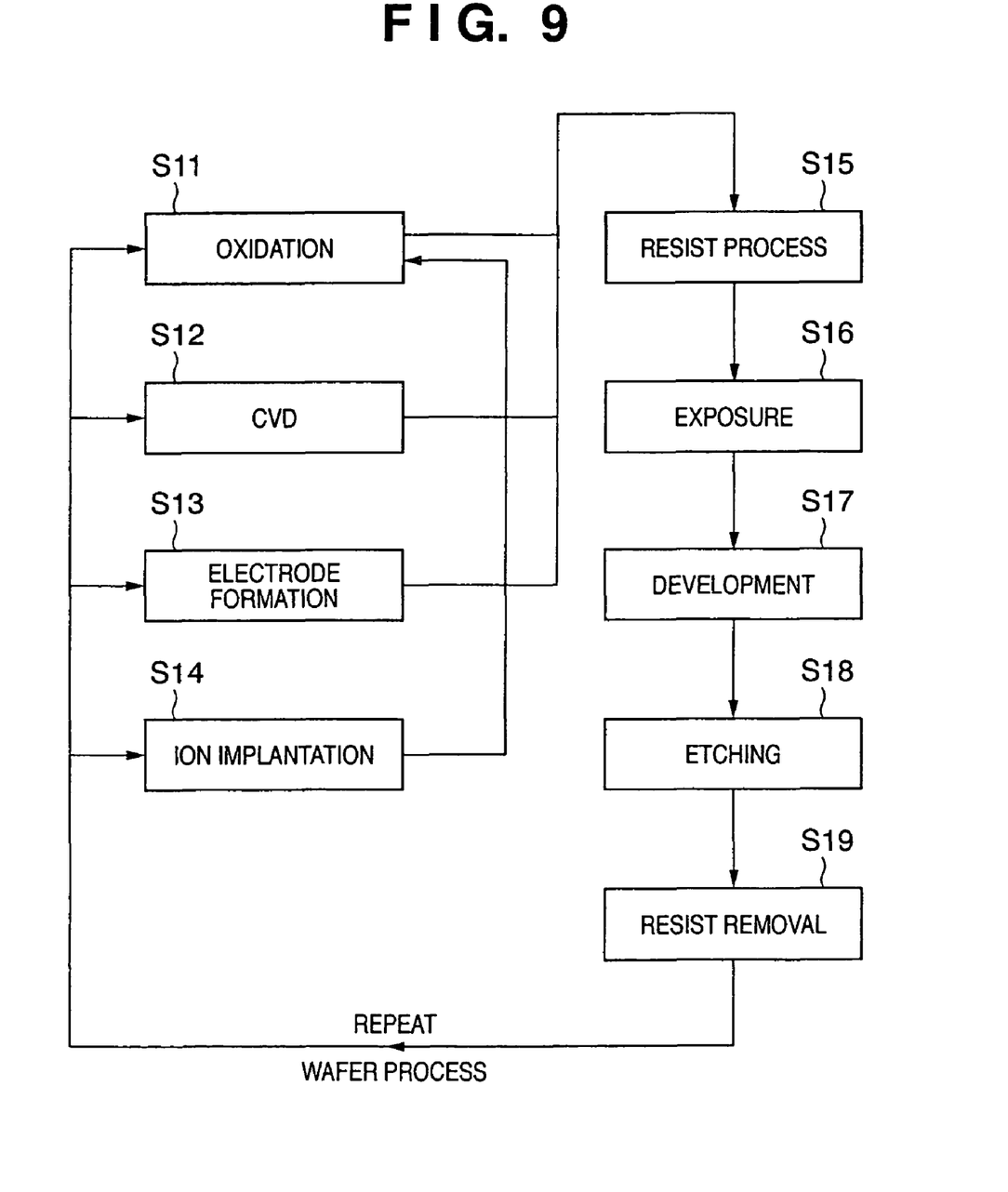
FIG. 9 is a flowchart showing the detailed flow of the wafer process.

FIG. 9 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist process), a photosensitive agent is applied to the wafer. In step 16 (exposure), the wafer is exposed by using the above-described exposure apparatus through the mask having the circuit pattern. In step 17 (development), the exposed wafer is developed. In step 18 (etching), portions other than the developed resist image are etched. In step 19 (resist removal), any unnecessary resist remaining after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus which has a projection optical system configured to project a pattern of a reticle onto a substrate, and exposes the substrate to light via the reticle and the projection optical system, with a space between the projection optical system and the substrate filled with liquid, said apparatus comprising:
   a supply nozzle configured to supply liquid to the space;
   a supply path configured to supply the liquid to said supply nozzle;
   a bypass which branches from said supply path;
   a supply control valve configured to change a flow rate of the liquid supplied from said supply path to said supply nozzle, to control the supply of the liquid to the space, while supplying liquid to said bypass; and
   a liquid quality sensor arranged in said bypass and configured to measure a purity of liquid in said bypass,
   wherein the supply of the liquid to the space is controlled based on a measurement result, obtained by said liquid quality sensor, of the quality of liquid that flows in the bypass, so that liquid having a purity satisfying a standard is supplied to the space.

2. An apparatus according to claim 1, further comprising a flow rate regulator configured to keep a flow rate of the liquid, that flows through said supply path, substantially constant.

3. An apparatus according to claim 1, further comprising a recovery nozzle configured to recover liquid from the space.

4. An apparatus according to claim 3, further comprising a recovery path configured to transfer the liquid recovered by said recovery nozzle,
   wherein said bypass is configured to merge into said recovery path.

5. An apparatus according to claim 4, further comprising a recovery control valve configured to change a flow rate of the liquid recovered from said recovery nozzle to said recovery path and a flow rate of the liquid recovered from said bypass to said recovery path.

6. An apparatus according to claim 1, further comprising:
   a temperature sensor configured to measure temperature of the liquid; and
   a temperature regulator configured to regulate temperature of the liquid based on a measurement performed by said temperature sensor.

7. An apparatus according to claim 6, wherein said temperature sensor is arranged in said bypass.

8. An apparatus according to claim 1, further comprising:
   a temperature sensor arranged in said bypass and configured to measure temperature of the liquid; and
   a temperature regulator configured to regulate temperature of the liquid based on a measurement performed by said temperature sensor,
   wherein said supply control valve is configured to supply the liquid from said supply path to at least said bypass.

9. An apparatus according to claim 1, wherein said bypass is arranged along a portion of the projection optical system.

10. An apparatus according to claim 1, wherein said bypass is arranged along at least a portion of said supply nozzle.

11. An apparatus according to claim 1, wherein said supply control valve is arranged near said supply nozzle.

12. A method of manufacturing a device using an exposure apparatus which has a projection optical system configured to project a pattern of a reticle onto a substrate, and exposes the substrate to light via the reticle and the projection optical system, with a space between the projection optical system and the substrate filled with liquid, the exposure apparatus comprising:

(i) a supply nozzle configured to supply liquid to the space;
(ii) a supply path configured to supply the liquid to the supply nozzle;
(iii) a bypass which branches from the supply path;
(iv) a supply control valve configured to change a flow rate of the liquid supplied from the supply path to the supply nozzle, to control the supply of the liquid to the space, while supplying liquid to the bypass; and
(v) a liquid quality sensor arranged in the bypass and configured to measure a purity of liquid in the bypass, wherein the supply of the liquid to the space is controlled based on a measurement result, obtained by the liquid quality sensor, of the quality of liquid that flows in the bypass, so that liquid having a purity satisfying a standard is supplied to the space, said method comprising steps of:
(a) setting the supply control valve so that the liquid flows into the bypass;
(b) monitoring the liquid in accordance with a measured value obtained by the liquid quality sensor;
(c) controlling the supply control valve so that the space between the projection optical system and the substrate is filled with the liquid;
(d) exposing the substrate to light via the reticle;
(e) developing the exposed substrate; and
(f) processing the developed substrate to manufacture the device.

13. An apparatus according to claim 1, wherein said liquid quality sensor includes a resistivity meter.

14. A method according to claim 12, wherein the liquid quality sensor includes a resistivity meter.

* * * * *